United States Patent
Hu

(10) Patent No.: US 9,107,332 B2
(45) Date of Patent: Aug. 11, 2015

(54) METHOD FOR MANUFACTURING PRINTED CIRCUIT BOARD

(71) Applicant: Zhen Ding Technology Co., Ltd., Tayuan, Taoyuan (TW)

(72) Inventor: Wen-Hung Hu, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 211 days.

(21) Appl. No.: 13/864,232

(22) Filed: Apr. 16, 2013

(65) Prior Publication Data

US 2014/0054075 A1 Feb. 27, 2014

(30) Foreign Application Priority Data

Aug. 24, 2012 (CN) .......................... 2012 1 0303774

(51) Int. Cl.
*H05K 1/09* (2006.01)
*H05K 3/34* (2006.01)
*H05K 3/40* (2006.01)
*H05K 3/24* (2006.01)
*H05K 3/42* (2006.01)

(52) U.S. Cl.
CPC ............ *H05K 3/3452* (2013.01); *H05K 3/4007* (2013.01); *H05K 3/4046* (2013.01); *H05K 3/244* (2013.01); *H05K 3/428* (2013.01); *H05K 2201/099* (2013.01); *H05K 2201/09481* (2013.01); *H05K 2201/09509* (2013.01); *H05K 2201/09563* (2013.01); *H05K 2203/0571* (2013.01); *H05K 2203/0577* (2013.01); *H05K 2203/1383* (2013.01); *Y10T 29/49167* (2015.01)

(58) Field of Classification Search
CPC ........... H05K 1/00; H05K 3/34; H05K 3/287; H05K 3/0023; H05K 3/3484; B23K 35/26; B23K 35/262; B09C 1/10; G03F 7/20; G03F 7/038
USPC .................. 174/257, 250; 435/262.5; 148/24; 430/319
See application file for complete search history.

(56) References Cited

U.S. PATENT DOCUMENTS

| | | | |
|---|---|---|---|
| 2003/0159761 A1* | 8/2003 | Ikeda et al. | 148/24 |
| 2007/0161100 A1* | 7/2007 | Tanaka et al. | 435/262.5 |
| 2008/0271912 A1* | 11/2008 | Yoshida et al. | 174/250 |

FOREIGN PATENT DOCUMENTS

| | | |
|---|---|---|
| TW | 200633089 A | 9/2006 |
| TW | 200635459 A | 10/2006 |
| TW | 201110842 A1 | 3/2011 |

* cited by examiner

*Primary Examiner* — Xiaoliang Chen
(74) *Attorney, Agent, or Firm* — Novak Druce Connolly Bove + Quigg LLP

(57) ABSTRACT

A printed circuit board includes a base, a circuit pattern, a solder mask, an activated metal layer, a plurality of metal seed layers, and a plurality of metal bumps. The conductive circuit pattern is formed on the base, to include a plurality of conductive pads. The solder mask is formed on a surface of the conductive circuit pattern and portions of the base are exposed from the circuit pattern. The solder mask includes blind vias corresponding to the pads, and laser-activated catalyst. The activated metal layer is obtained by laser irradiation at the wall of the blind via. The activated metal layer is in contact with the solder mask. The metal seed layer is formed on the activated metal layer and the pads. Each metal bump is formed on the metal seed layer, and each metal bump protrudes from the solder mask.

7 Claims, 9 Drawing Sheets

METHOD FOR MANUFACTURING PRINTED CIRCUIT BOARD

BACKGROUND

1. Technical Field

The present disclosure generally relates to printed circuit boards (PCBs), and particularly relates to a printed circuit board and a method for manufacturing the printed circuit board.

2. Description of Related Art

To accommodate development of miniaturized electronic products with multiple functions, printed circuit boards are widely used.

A PCB usually needs a plurality of electrically conductive bumps or pads for supporting solder balls. The electrically conductive bumps need to pass through a solder mask of the PCB, and are electrically connected to electrically conductive circuit traces of the PCB, which are under the solder mask. In a method of manufacturing the PCB, the solder mask with first openings is first formed on the electrically conductive circuit traces. Then, a photoresist layer with second openings is formed on the solder mask, and the first openings must align with the second openings. Finally, electrically conductive bumps are formed in the first openings, and protrude from the solder mask. Because the first openings need to be aligned with the second openings, productivity of the printed circuit board is thus lower.

What is needed therefore is a printed circuit board, and a method for manufacturing the printed circuit board to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

A method for manufacturing a printed circuit board includes the following steps.

Figure 1:
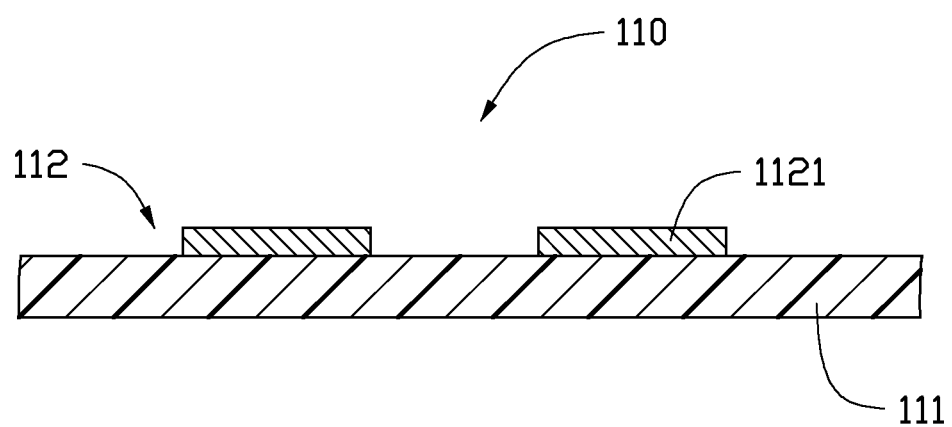
FIG. 1 shows a circuit substrate according to an exemplary embodiment.

FIG. 1 shows step 1, in which a circuit substrate 110 is provided. The circuit substrate 110 includes a base 111 and an electrically conductive circuit pattern 112. The circuit substrate 110 may be a single layer circuit substrate, or a multi-layer circuit substrate. When the circuit substrate 110 is a single layer circuit substrate, the base 111 is a single layer dielectric base. When the circuit substrate 110 is a multilayer circuit substrate, the base 111 is a stacked structure, in which a plurality of electrically conductive circuit patterns and a plurality of dielectric layers are stacked alternately. The electrically conductive circuit pattern 112 contacts a dielectric layer base or a dielectric layer. In the present embodiment, the electrically conductive circuit pattern 112 includes a plurality of electrically conductive pads 1121, which are arranged in an array. It is understood that the electrically conductive circuit pattern 112 also includes at least one electrically conductive trace (not shown).

Figure 2:
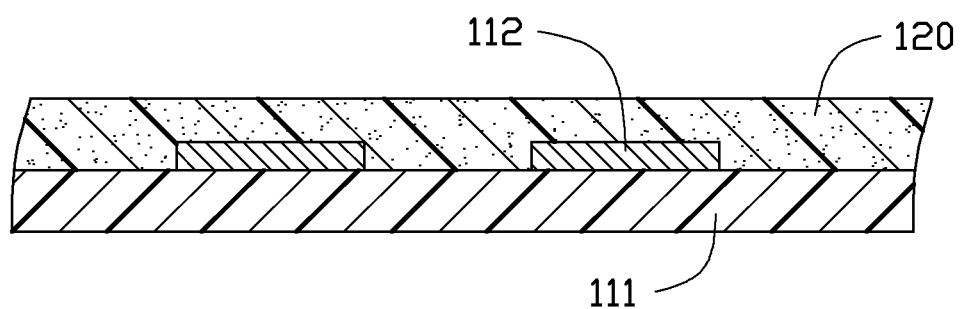
FIG. 2 shows a solder mask formed on the circuit substrate of FIG. 1.

FIG. 2 shows step 2, in which a solder mask 120 is formed on a surface of the electrically conductive circuit pattern 112 and a surface of the base 111 exposed from the electrically conductive circuit pattern 112. In the present embodiment, the solder mask 120 is formed by printing with solder resist ink, exposing the solder resist ink, and developing the solder resist ink. The solder resist ink includes laser-activated catalyst. The Laser-activated catalyst is converted into an electrically conductive material by laser irradiation, such that an electro-less copper plating can be directly processed in the following step. A mass percent of laser-activated catalyst in the solder resist ink is in a range from 0.1% to 30%, preferably from 0.5% to 10%. The Laser-activated catalyst may be heavy metal mixture oxide spinel, for example, copper-chromium oxide spinel. The Laser-activated catalyst may be metal salt, for example, copper sulfate or cupric rhodanate.

When the electrically conductive circuit pattern 112 includes the electrically conductive traces, a plurality of openings are defined in the solder mask 120, such that portions of electrically conductive traces, which need to be electrically connected to other electronic elements or other printed circuit boards, are exposed in the openings.

Figure 3:
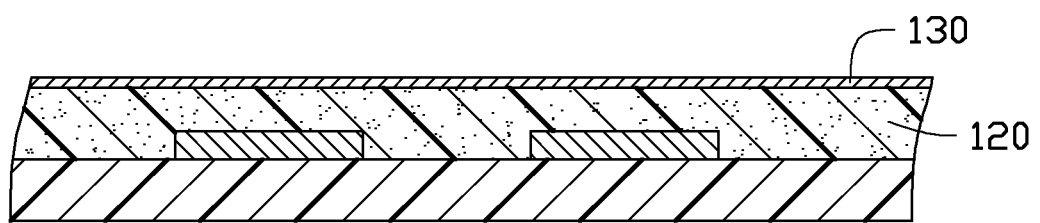
FIG. 3 shows a first metal seed layer formed on the solder mask of FIG. 2.

FIG. 3 shows step 3, in which a first metal seed layer 130 is formed on a surface of the solder mask 120. The first metal seed layer 130 may be formed by a sputtering or electro-less plating process. A material of the first metal seed layer 130 may be titanium, nickel, vanadium, copper, lead, aluminium alloy, tungsten, tungsten alloy, chromium, chromium alloy, silver, or gold, for example.

Figure 4:
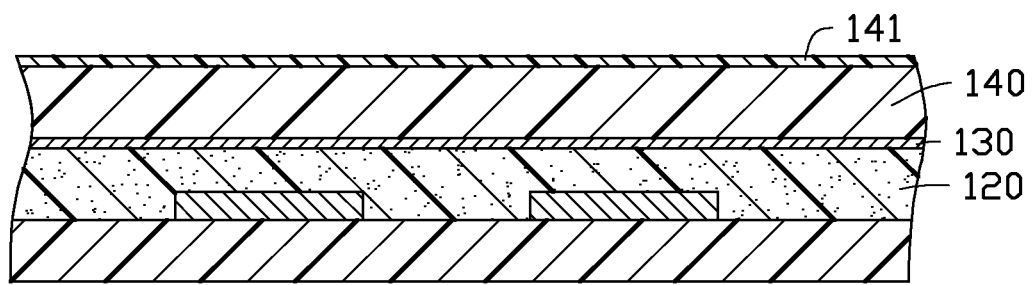
FIG. 4 shows a photoresist layer formed on the first metal seed layer of FIG. 3.

FIG. 4 shows step 4, in which a photoresist layer 140 is formed on the first metal seed layer 130. In the present embodiment, the photoresist layer 140 is formed by laminating a dry film on the first metal seed layer 130. The dry film includes the photoresist layer 140 and a protection film 141 for protecting the photoresist layer 140. After laminating, the protection film 141 may not be removed from the photoresist layer 140, and stays on the photoresist layer 140.

Figure 5:
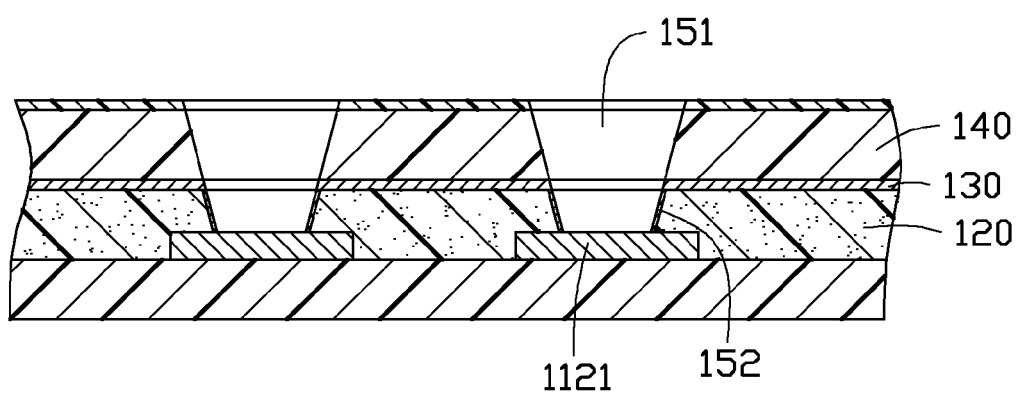
FIG. 5 shows blind vias formed in the photoresist layer, the first metal seed layer, and the solder mask, and activated metal layers formed on the inner sidewalls of the blind vias of FIG. 4, which are in the solder mask.

FIG. 5 shows step 5, in which a plurality of blind vias 151 are defined in the photoresist layer 140, the first metal seed layer 130, and the solder mask 120. The blind vias 151 spatially correspond to the electrically conductive pads 1121. Each electrically conductive pad 1121 is exposed in one blind via 115. In addition, under laser action, laser-activated catalyst at the wall of a blind via 151, which is in the solder mask 120, is activated by laser ablation, thereby obtaining an activated metal layer 152. The activated metal layer 152 electrically connects the first metal seed layer 130 and the electrically conductive pad 1121.

Figure 6:
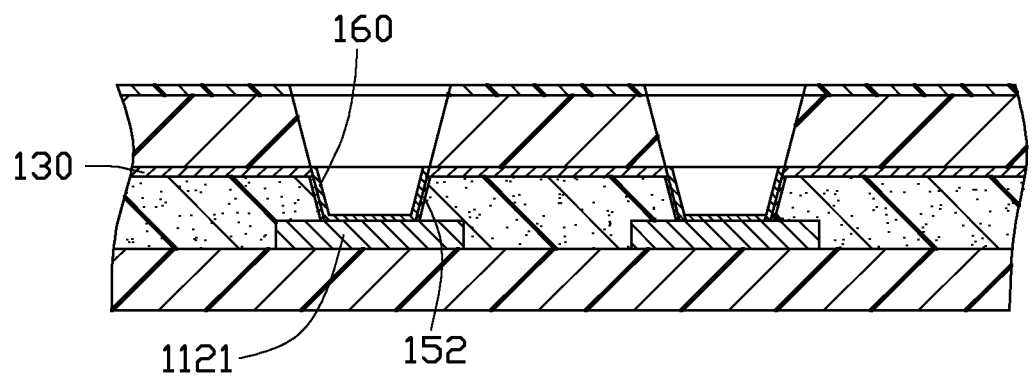
FIG. 6 shows a second metal seed layer formed on the activated metal layer of FIG. 5.

FIG. 6 shows step 6, in which a second metal seed layer 160 is formed on the activated metal layer 152. In the present embodiment, the second metal seed layer 160 is formed on the activated metal layer 152 by electro-less copper plating, such that an electrical conductivity between the activated metal layer 152 and the first metal seed layer 130 is improved.

Figure 7:
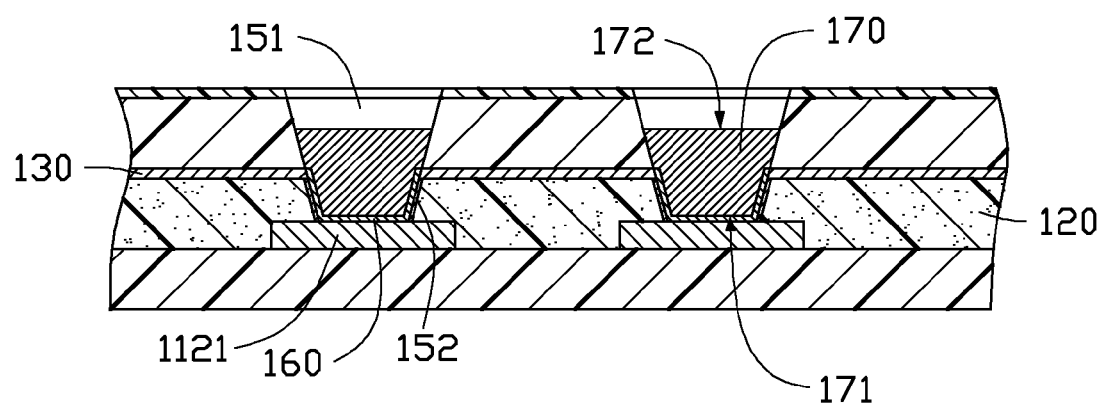
FIG. 7 shows a metal bump formed in each blind via of FIG. 6.

FIG. 7 shows step 7, in which a metal bump 170 is formed in the blind via 151. In the present embodiment, the metal bump 170 is formed in the blind via 151 by electroplating. Because the activated metal layer 152 electrically connects the first metal seed layer 130 and the second metal seed layer 160, the metal bump 170 can be formed in the blind via 151 by electroplating. Each metal bump 170 includes a bottom surface 171 and a top surface 172. The bottom surface 171 is in contact with an electrically conductive pad 1121. A distance between the bottom surface 171 and the top surface 172 of each metal bump 170 is greater than a thickness of the solder mask 120.

Figure 8:
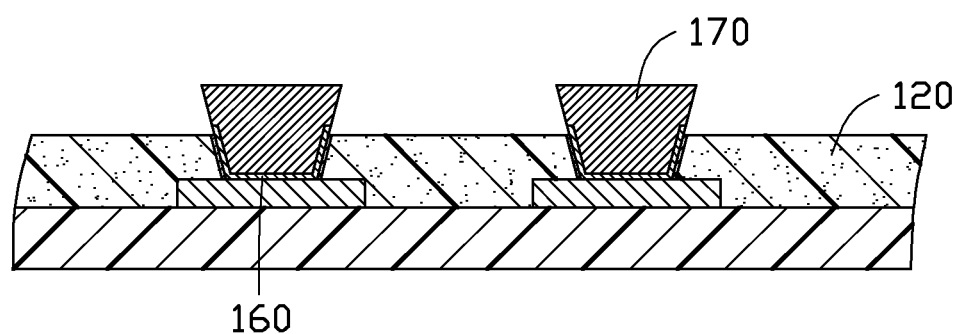
FIG. 8 shows the photoresist layer and the first metal seed layer removed from the circuit substrate of FIG. 7.

FIG. 8 shows step 8, the photoresist layer 140 and the first metal seed layer 130 are removed from the base 111. In the present embodiment, the photoresist layer 140 is removed from the base 111 using stripping solution. The stripping solution chemically reacts with the photoresist layer 140, such that the photoresist layer 140 is dissolved. Accordingly, the photoresist layer 140 is removed from the base 111. The first metal seed layer 130 is removed from the base 111 by micro-etching. That is, the first metal seed layer 130 is dissolved by a micro-etching solution, being thereby taken off the base.

Figure 9:
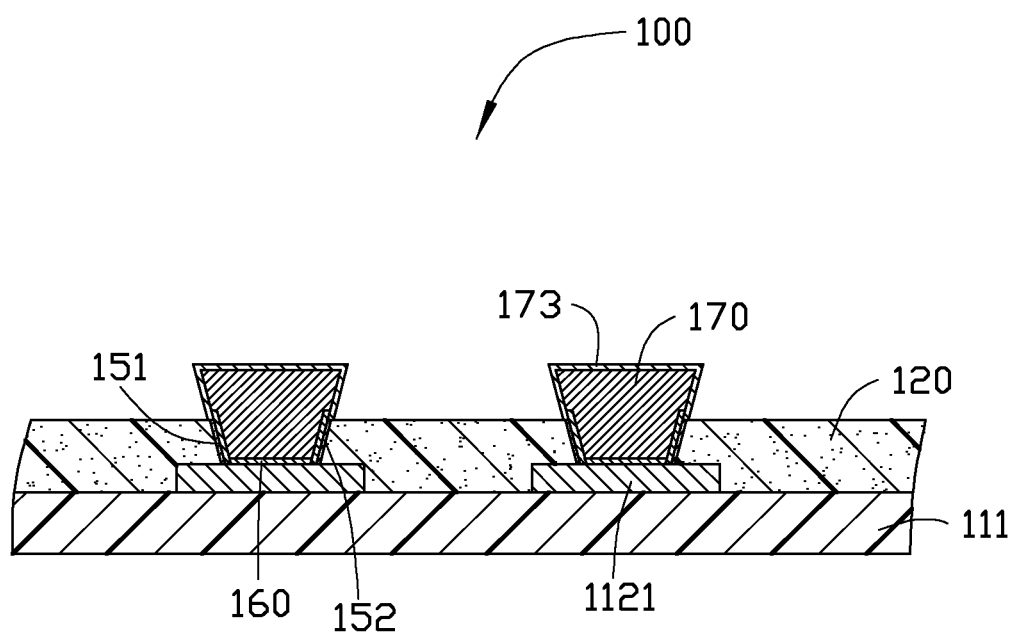
FIG. 9 shows a printed circuit board according to the exemplary embodiment.

FIG. 9 shows step 9, in which a surface treatment is applied to portions of the metal bumps 170, which protrude out of the solder mask 120, thereby obtaining a printed circuit board 100.

In the present embodiment, when the surface treatment is applied to portions of the metal bumps 170, a protection layer 173 is formed over a surface of the portion of each metal bump 170 which protrudes out of the solder mask 120, such that the surface of the portion of each metal bump 170 which protrudes out of the solder mask 120 is protected. A material of the protection layer 173 may be tin, lead, silver, gold, nickel, palladium, a single layer structure made of an alloy of such metals, or a multilayer structure made of a combination of such metals, for example. The protection layer 173 may be made of organic solderable preservative. When the protection layer 173 is made of metal, the protection layer 173 may be formed by electroplating. When the protection layer 173 is made of organic solderable preservative, the protection layer 173 may be formed chemically.

The printed circuit board 100 obtained by the above method includes the base 111, the electrically conductive circuit pattern 112, the solder mask 120, the activated metal layer 152, the second metal seed layer 160, and the metal bumps 170.

The electrically conductive circuit pattern 112 is formed on the base 111. The electrically conductive circuit pattern 112 includes a plurality of electrically conductive pads 1121 arranged in an array.

The solder mask 120 is formed on the surface of the electrically conductive circuit pattern 112 and the surface of the base 111 is exposed from the electrically conductive circuit pattern 112. The solder mask 120 is made of the solder resist ink includes laser-activated catalyst. The Laser-activated catalyst is converted into an electrically conductive material by laser irradiation, such that an electro-less copper plating process can be directly applied in the following step. A mass percent of laser-activated catalyst in the solder resist ink is in a range from 0.1% to 30%, preferably from 0.5% to 10%. The laser-activated catalyst may be a heavy metal mixture oxide spinel, for example, copper-chromium oxide spinel. The Laser-activated catalyst may be metal salt, for example, copper sulfate, copper hydroxide phosphate, or cupric rhodanate.

The printed circuit board 100 also includes a plurality of blind vias 151. The blind vias 151 spatially correspond to the electrically conductive pads 1121. Each blind via 151 passes through the solder mask 120. The activated metal layer 152 is formed in the inner sidewall of every blind via 151, and is in contact with the solder mask 120. The second metal seed layer 160 is formed on the activated metal layer 152 and the corresponding electrically conductive pad 1121. A portion of each metal bump 170 is in a blind via 151, and the other portion of each metal bump 170 protrudes from the blind via 151. The portion of each metal bump 170 in the blind via 151 is in contact with the second metal seed layer 160.

In the present embodiment, the protection layer 173 is formed on the surface of the portion of the metal bump 170 which protrudes from the solder mask 120. A material of the protection layer 173 may be tin, lead, silver, gold, nickel, palladium, a single layer structure made of an alloy of one of such metals, or a multilayer structure made of a combination of such metals, for example. The protection layer 173 may be made of organic solderable preservative. When the protection layer 173 is made of metal, the protection layer 173 may be formed by electroplating. When the protection layer 173 is made of organic solderable preservative, the protection layer 173 may be formed chemically.

In the method for manufacturing the printed circuit board 100, the blind via 151 is defined using laser ablation. Accordingly, there is no need to first define a plurality of smaller openings in the solder mask by a first developing process and a plurality of larger openings in the photoresist layer by a second developing process, and there is no need to align the smaller openings in the solder mask with the larger openings in the photoresist layer. Productivity of the printed circuit board 100 is thus higher. In addition, the solder mask 120 is made of solder resist ink including laser-activated catalyst. When the blind via 151 is defined by laser ablation, laser-activated catalyst at the wall of blind via 151, which is in the solder mask 120, is activated to obtain the activated metal layer 152. Then, the second metal seed layer 160 can be easily obtained by electro-less copper plating. Furthermore, because the blind via 151 is precisely defined by laser ablation, the blind via 151 can be made smaller. A distribution density of the blind via 151 is greater, and a distribution density of the metal bump 170 is also greater.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A method for manufacturing a printed circuit board, comprising:

providing a circuit substrate, the circuit substrate comprising a base and an electrically conductive circuit pattern, the electrically conductive circuit pattern comprising a plurality of electrically conductive pads;

forming a solder mask on a surface of the electrically conductive circuit pattern and a surface of the base exposed from the electrically conductive circuit pattern, the solder mask comprising laser-activated catalyst;

forming a first metal seed layer on a surface of the solder mask;

forming a photoresist layer on a surface of the first metal seed layer;

defining a plurality of blind vias in the photoresist layer, the first metal seed layer, and the solder mask using laser ablation, the blind vias spatially corresponding to the electrically conductive pads, each electrically conductive pad exposed from the corresponding blind via, laser-activated catalyst at the wall of blind via being activated under the laser ablation, thereby obtaining an activated metal layer;

forming a second metal seed layer on the activated metal layer, the second metal seed layer being electrically connected to the first metal seed layer;

forming a metal bump in each blind via by electroplating, the metal bump protruding the surface of the solder mask; and removing the first metal seed layer and the photoresist layer off from the circuit substrate, thereby obtaining a printed circuit board.

2. The method of claim 1, wherein the solder mask is formed by printing a solder resist ink, exposing the solder resist ink, and developing the solder resist ink, and the solder resist ink comprises laser-activated catalyst.

3. The method of claim 2, wherein a mass percent of the laser-activated catalyst in the solder resist ink is in a range from 0.1% to 30%.

4. The method of claim 3, wherein the laser-activated catalyst is heavy metal mixture oxide spinel or metal salt.

5. The method of claim 4, wherein the laser-activated catalyst is copper-chromium oxide spinel, copper sulfate, copper hydroxide phosphate, or cupric rhodanate.

6. The method of claim 1, wherein the second metal seed layer is formed by electro-less copper plating.

7. The method of claim 6, further comprising a step of forming a protection layer on a surface of each metal bump protruding the solder mask.

* * * * *